(12) United States Patent
Miller et al.

(10) Patent No.: US 7,034,520 B1
(45) Date of Patent: Apr. 25, 2006

(54) INTEGRATED CIRCUIT TESTER

(75) Inventors: Wayne H. Miller, Los Altos, CA (US);
Chris S. Paretich, Larkspur, CA (US);
James K. Lubin, Oakland, CA (US);
Stuart M. Firestone, Danville, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/223,421

(22) Filed: Sep. 9, 2005

(51) Int. Cl.
*G01R 31/26* (2006.01)

(52) U.S. Cl. .................................. 324/158.1; 324/765
(58) Field of Classification Search .............. 74/490.11
See application file for complete search history.

(56) References Cited

U.S. PATENT DOCUMENTS 3,970,934 A * 7/1976 Aksu .......................... 324/754
4,213,666 A * 7/1980 Braginetz et al. ........... 439/341

* cited by examiner

*Primary Examiner*—Vinh Nguyen
*Assistant Examiner*—Russell M. Kobert
(74) *Attorney, Agent, or Firm*—John Smith-Hill; Smith-Hill and Bedell

(57) ABSTRACT

A product change tool for selectively engaging a product change element with an IC tester interface and disengaging the product change element from the tester interface includes a mobile frame mounted to a base frame and constrained to move relative to the base frame along an axis of linear movement, and a force mechanism for urging the mobile frame to move along the axis of linear movement relative to the base frame. The force mechanism includes first and second links pivotally connected together at their proximal ends and secured at their distal ends to the mobile frame and the base frame respectively. The distal ends of the links are spaced apart along the axis of linear movement and the proximal ends of the links are between the distal ends relative to that axis. An actuator is coupled to the proximal ends of the links for urging the proximal ends of the links in directions transverse to the axis of linear movement, whereby the spacing of the distal ends of the links along the axis changes and the mobile frame moves relative to the base frame along the axis.

5 Claims, 5 Drawing Sheets

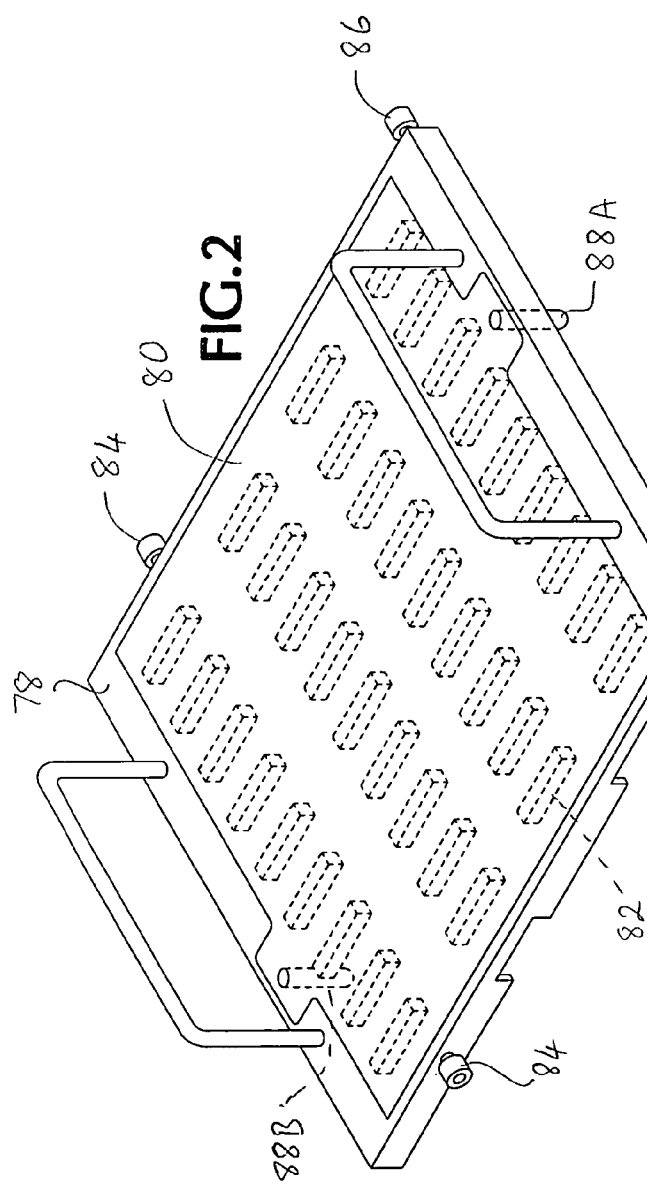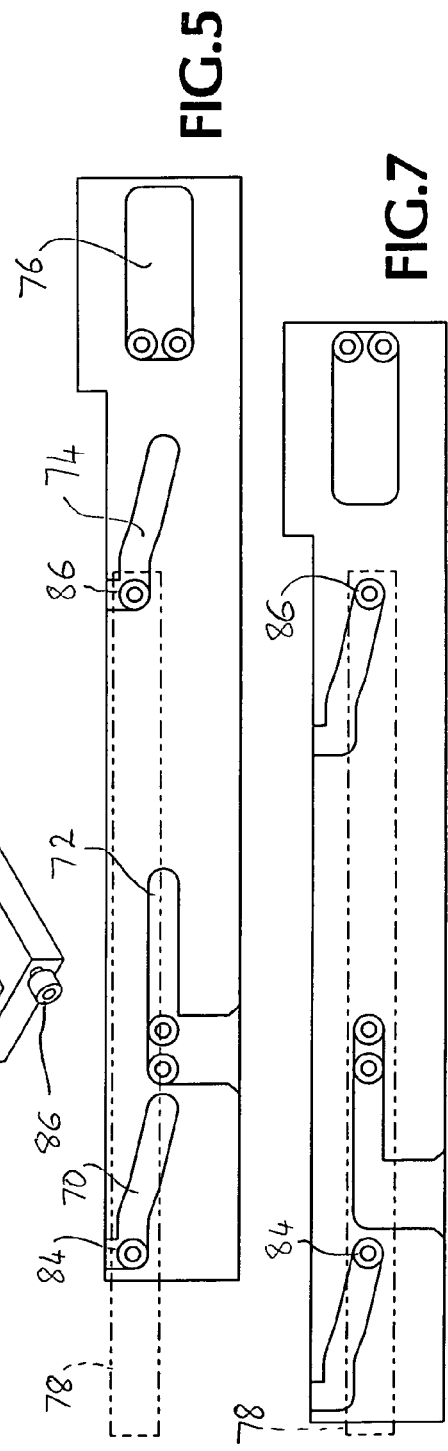

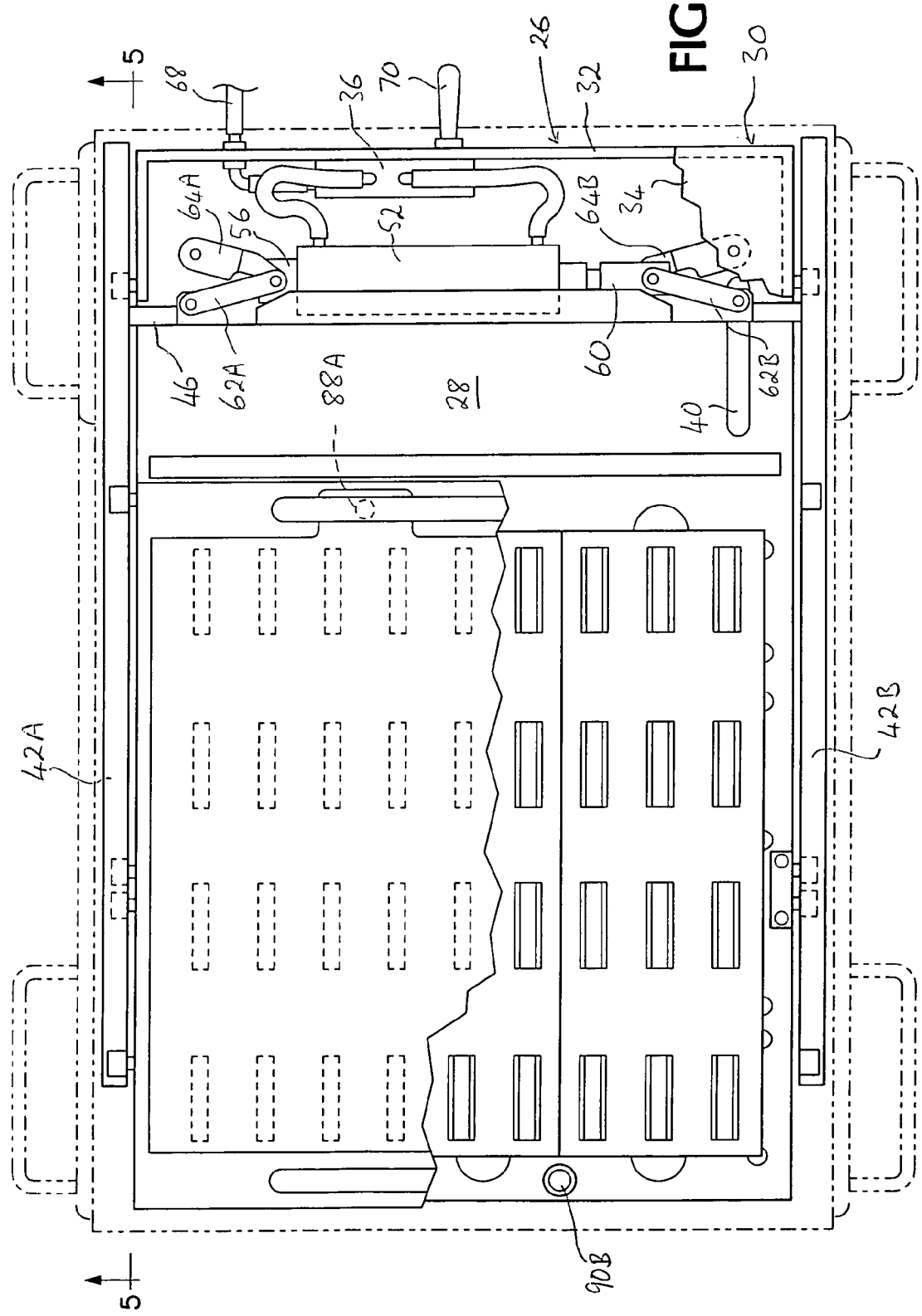

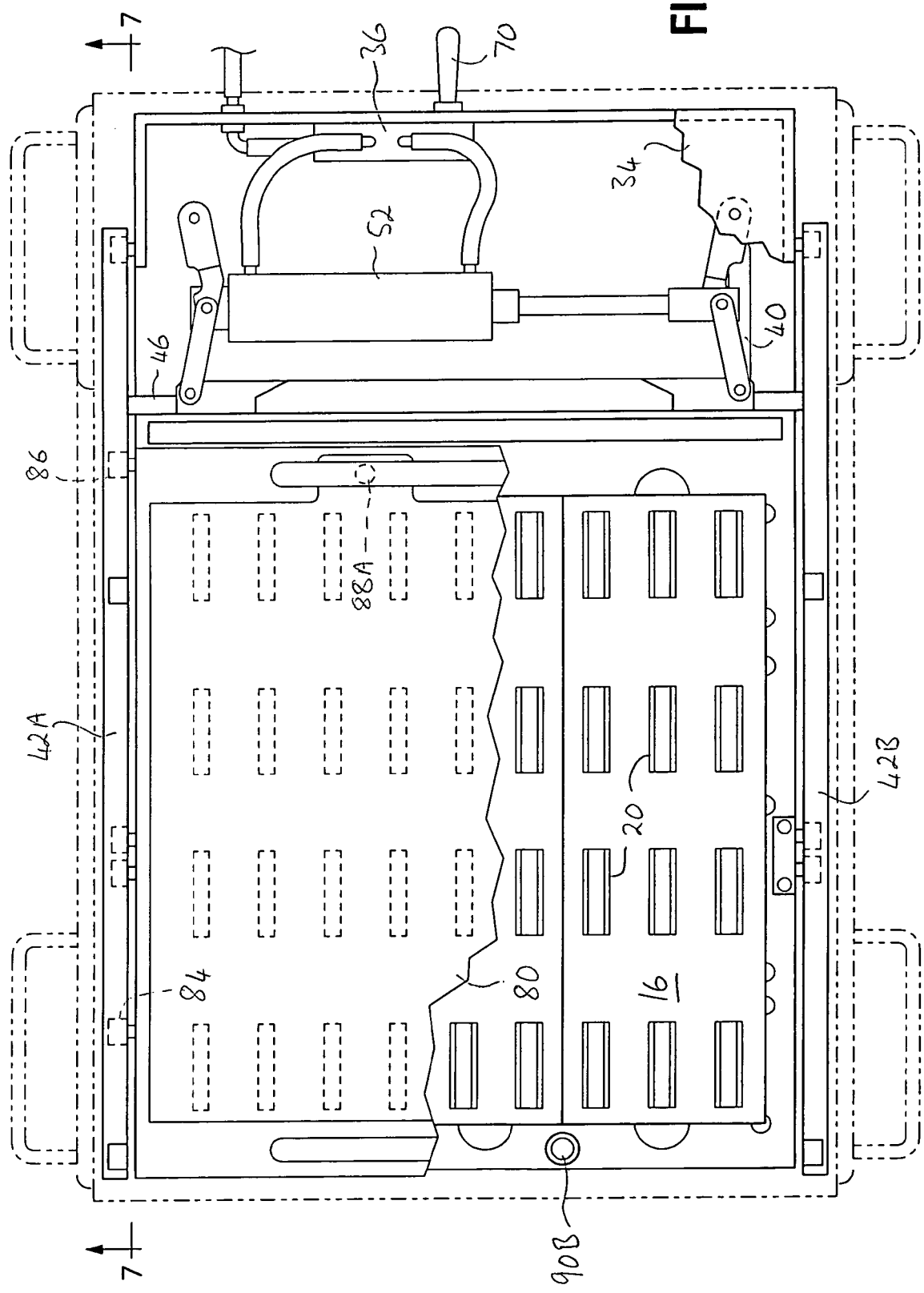

INTEGRATED CIRCUIT TESTER

BACKGROUND OF THE INVENTION

This invention relates to an integrated circuit tester.

A typical integrated circuit tester includes a test head that comprises a main chassis having numerous pin electronics cards mounted therein. The pin electronics cards are disposed parallel to each other and perpendicular to an interconnection board that is disposed above the pin electronics cards. Terminals of the pin electronics cards are electrically connected to terminals on the lower side of the interconnection board.

On its upper side, the interconnection board is provided with an array of connectors having terminals connected to the terminals on the lower side of the interconnection board.

The test head is used in conjunction with a so-called DUT board or load board. The DUT board has sockets on its upper side for receiving units of a device under test (DUT) and has connectors on its lower side for engaging the connectors of the interconnection board. The DUT board serves as an interface between the test head and a device handler, which places units of the DUT in the DUT sockets of the DUT board so that the tester can carry out a test on the particular units.

The DUT board is especially designed and manufactured for use with units of a particular device or product. Thus, in the event that the tester has been used to test units of a first device and is subsequently to be used to test units of a second, different, device, in may be necessary to change the DUT board. This involves removing the DUT board for the first device from the test head and attaching the DUT board for the second device to the test head. Because of the large number of pins in the connectors of the interconnection board (each connector may have 100 or more pins), the force required to engage a DUT board with the interconnection board, or disengage a DUT board from the interconnection board, is considerable. In addition, it is necessary to ensure that the DUT board, when being attached or removed, moves perpendicular to the plane of the interconnection board so that neither the DUT board nor the interconnection board will be damaged by tilting of the DUT board relative to the interconnection board.

SUMMARY OF THE INVENTION

According to the present invention there is provided an integrated circuit tester comprising a tool for selectively engaging a product change element with a tester interface and disengaging the product change element from the tester interface, said tool comprising a base frame attached to the tester interface, a mobile frame mounted to the base frame and constrained to move relative to the base frame along an axis of linear movement, and a force mechanism for urging the mobile frame to move along said axis of linear movement relative to the base frame, the force mechanism comprising first and second links each having a proximal end and a distal end, the links being pivotally connected together at their proximal ends and the distal ends of the first and second links being secured to the mobile frame and the base frame respectively, the distal ends of the links being spaced apart along said axis and the proximal ends of the links being between the distal ends relative to said axis, and the force mechanism also comprising an actuator coupled to the proximal ends of the links for urging the proximal ends of the links in directions transverse to said axis, whereby the spacing of the distal ends of the links along said axis changes and the mobile frame moves relative to the base frame along said axis, and wherein the mobile frame interacts with the product change element in a manner such that movement of the mobile frame relative to the base frame in a first direction along said axis forces the product change element towards the base frame and movement of the mobile frame relative to the base frame in a second direction, opposite said first direction, forces the product change element away from the base frame.

BRIEF DESCRIPTION OF THE DRAWINGS

For a better understanding of the invention, and to show how the same may be carried into effect, reference will now be made, by way of example, to the accompanying drawings, in which FIG. 2 is a perspective view of a product change assembly for use with the tester shown in FIG. 1, FIG. 4 is a partial top plan view of the tester, illustrating parts of the insertion/extraction tool in dashed lines, FIG. 5 is a sectional view of the insertion/extraction tool taken on the line 5—5 of FIG. 4, FIG. 6 is a view similar to FIG. 4 showing the product change assembly fully installed, and FIG. 7 is a sectional view of the insertion/extraction tool taken on the line 7—7 of FIG. 6.

Figure 1:
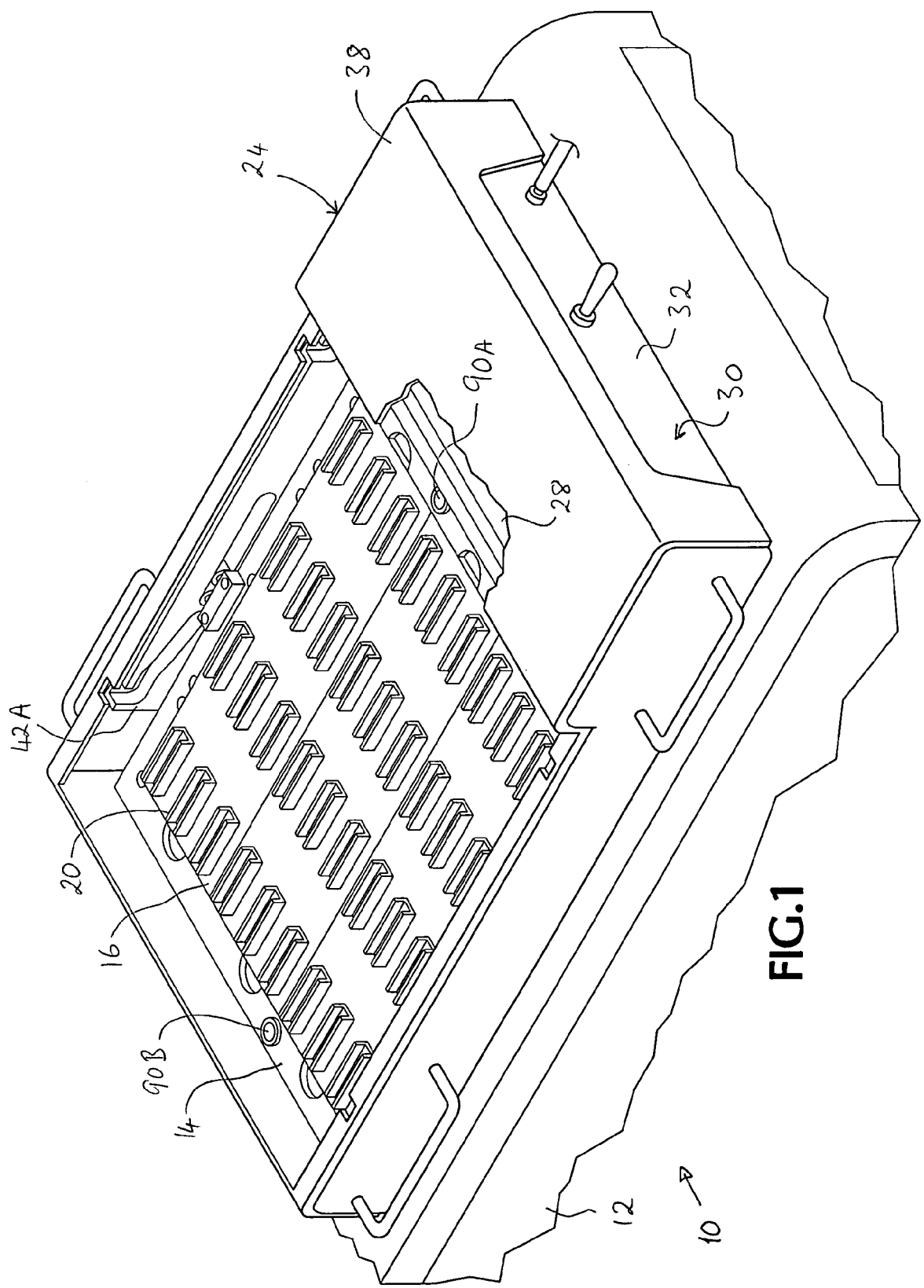
FIG. 1 is a partial perspective view of a semiconductor integrated circuit tester embodying the present invention.

In the following detailed description, the tester is described for convenience in a particular orientation. It should, however, be understood that the tester may be used in another orientation and that the invention is not restricted to the orientation shown in the drawings.

DETAILED DESCRIPTION

FIG. 1 illustrates a tester 10 having a main chassis (not shown) that is located in a sheet metal housing 12 and in which multiple pin electronics cards (not shown) are mounted. The tester includes a tester face plate 14 that is attached to the main chassis. An interconnection board 16 is attached to the tester face plate. The interconnection board may be a single board or alternatively it may be composed of multiple boards in side-by-side relationship, as shown.

The interconnection board 16 has several connectors 20 on its upper surface, each connector comprising a body of electrically insulating material and numerous conductive pins extending through the body of insulating material. At the underside of the interconnection board, the pins are connected to terminals of the pin electronics cards.

Referring to FIGS. 1 and 4, an insertion/extraction tool 24 includes a tool chassis 26 and a sheet metal housing 38 (FIG. 1) which is shown partially broken away and is attached to the tool chassis to protect the internal mechanism of the tool and for worker safety purposes.

The tool chassis 26 includes a base plate 28 that is rigidly attached to the main chassis of the tester and an inner housing 30 that is attached to the base plate and includes a wall 32 perpendicular to the base plate and a top plate 34 parallel to the base plate 28. A control valve 36 is attached to the wall 32.

The insertion/extraction tool also comprises a mobile assembly that is attached to the base plate 28 in a manner permitting movement of the mobile assembly relative to the tester face plate. The mobile assembly includes two parallel cam bars 42A, 42B extending adjacent opposite respective edges of the tester face plate and a transverse bar 46 that is attached to the cam bars 42 and is oriented perpendicular to the cam bars. A bracing plate (not shown) is attached to the cam bars 42 and the transverse bar 46 in order to restrain these bars against relative movement. Adjacent the transverse bar 46 is a force mechanism 48 for forcing the mobile assembly to move relative to the base plate 28 in directions parallel to the cam bars. The base plate 28 is formed with a guide groove 40 extending parallel to the longitudinal axes of the cam bars and a bearing (not shown) attached to the transverse bar rides in the guide groove.

The force mechanism includes a double-acting pneumatic actuator 52 that is oriented along an operating axis perpendicular to the longitudinal axes of the cam bars. The actuator is provided with a mounting bracket 56 at one end and a clevis 60 at the other end. There are two links 62A,B and 64A,B at each end of the actuator. Each link has a proximal end at which it is attached to the actuator at a scissor point and also has an opposite distal end. The links 62A, 62B are pivotally attached at their proximal ends to the mounting bracket 56 and the links 64A, 64B are pivotally attached at their proximal ends to the clevis 60. The links of each pair extend to opposite respective sides of the operating axis of the actuator and each link is inclined at an acute angle to the operating axis of the actuator. Each link 62A, 62B is provided at its distal end with a pin that is fitted in a bore formed in a projection from the transverse bar 46. Each link 64A, 64B is provided at its distal end with a pin that is fitted in a bore in the base plate 28 at its lower end and is fitted in a bore in the top cover plate 34 at its upper end. The bearing that rides in the guide groove 40 is mounted on the lower end of the pin provided at the distal end of the link 62B.

The pneumatic actuator 52 has an extension port and a retraction port and these ports are connected to the control valve 36. The valve is connected to a supply of compressed air via a flexible tube 68 and has a vent to atmosphere. The valve has a control knob 70 for transferring the valve selectively to one of three positions. The valve has a normal, non-operating or rest position in which it is closed and does not supply compressed air to either port of the actuator. In a first operating position, the valve supplies air to the extension port of the actuator and vents the retraction port, and the actuator expands lengthwise, whereas in the second operating position the valve supplies compressed air to the retraction port of the actuator and vents the extension port and the actuator contracts lengthwise. Thus, when the valve is transferred from its normal or rest position to the first operating position, the actuator forces the scissor points of the links apart and accordingly the pins at the distal ends of each pair of links 62A,B and 64A,B are forced apart. This action causes the mobile assembly to move relative to the tester face plate in the direction of the arrow X. When the valve is transferred from its rest position to the second operating position, the actuator pulls the scissor points together and accordingly the pins at the distal ends of each pair of links are drawn together and the mobile frame is forced in the opposite direction.

Referring to FIGS. 5 and 7, each cam bar is formed with four cam slots 70, 72, 74, 76. Each of the slots 70 and 74 has a mouth at which it opens at the upper edge of the cam bar and includes a segment that is inclined relative to the longitudinal axis of the cam bar. The slots 72 and 76 extend parallel to the longitudinal axis of the cam bar. Followers attached to the tester face plate run in the slots 72 and followers attached to the tool chassis base plate run in the slots 76. The slots 72 are open at the bottom of the cam bars for ease of installation and removal whereas the slots 76 are closed.

Referring to FIG. 2, the product change assembly includes a product change frame 78 and an interface board, such as a DUT board 80, attached to the product change frame and having connectors 82 at its underside. The product change assembly may accommodate another form of interface board, such as a board for interfacing to a calibration instrument, in lieu of the DUT board 80.

Two cam followers 84, 86 project laterally from each side of the product change frame 78. Alignment pins 88A, 88B project downward from the product change frame.

Figure 3:
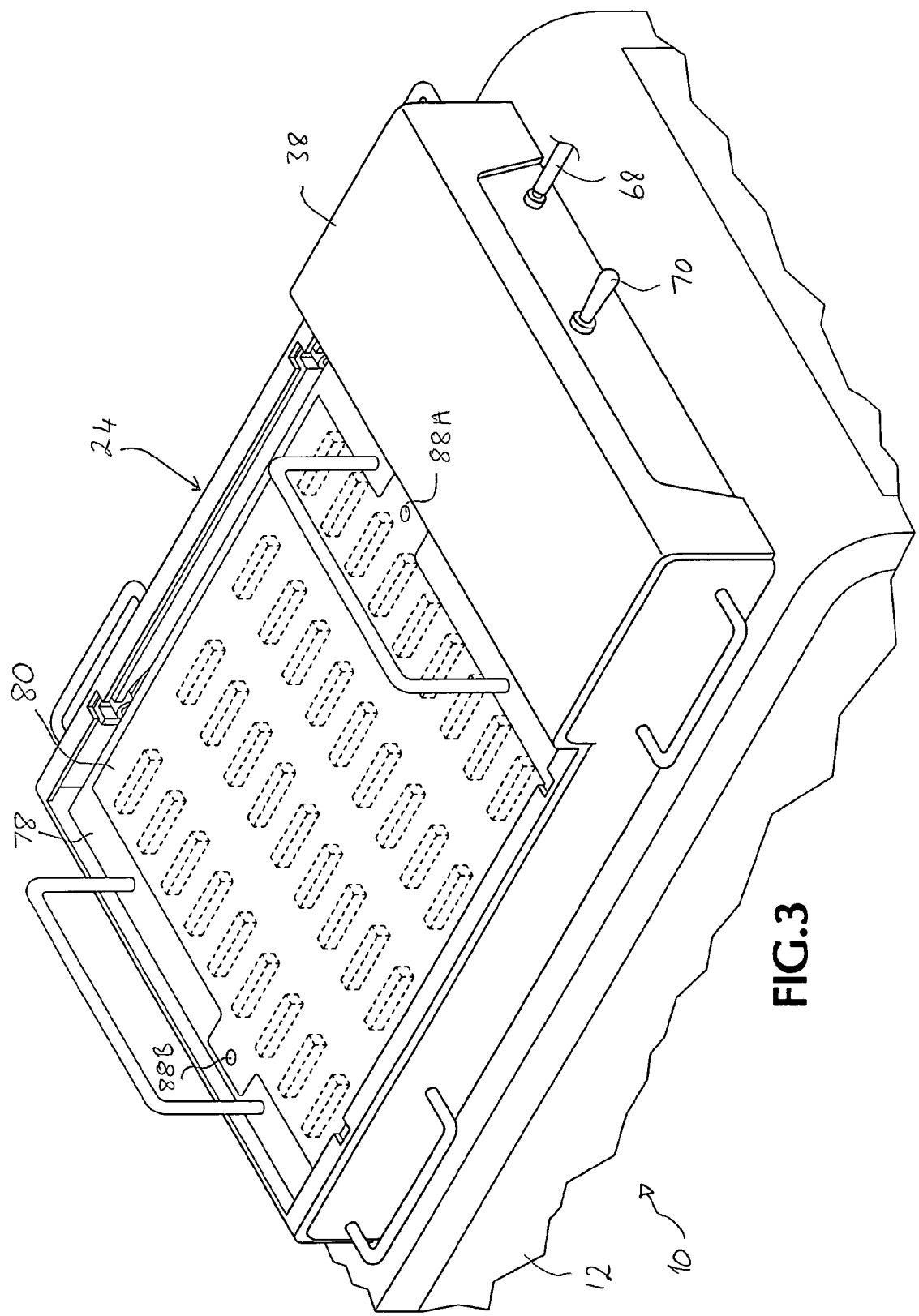
FIG. 3 is a perspective view of the tester with the product change assembly partially installed in the insertion/extraction tool.

We will assume for the purpose of the following discussion that the insertion/extraction tool is attached to the test head, that there is no product change assembly currently installed in the tool, that the valve is currently in the rest position, and that the valve was previously operated to position the insertion/extraction tool in the configuration shown in FIGS. 3–5.

A technician places the product change assembly in the insertion/extraction tool with the followers 84, 86 in the mouths of the respective cam slots 70, 74. Each follower 84, 86 then rests on a dwell at the bottom of the mouth of the respective cam slot. In this position, the alignment pins of the product change frame enter corresponding alignment bores 90A, 90B (see also FIG. 1) of the tester face plate 14. The alignment pins 88A, 88B differ in cross-sectional shape and/or size in order to ensure that the product change assembly is correctly oriented relative to the insertion/extraction tool. The technician then operates the control knob 70 to transfer the valve to the insertion position. The valve supplies compressed air to the extension port of the pneumatic actuator and allows the retraction port to vent to atmosphere. As explained above, the mobile assembly is forced to move in the direction of the arrow X. The bearing riding in the guide groove 40 prevents skewing of the mobile assembly relative to the tool chassis 26.

As the cam bars move longitudinally in the direction of the arrow X, the cam followers 84, 86 enter the inclined segments of the cam slots 70, 74. Due to interaction between the upper surface of the slot and the follower, the followers are forced downward relative to the cam bars. Interaction between the cam bars and the followers that are attached to the tester face plate and tool chassis prevents vertical movement of the cam bars relative to the test head chassis and so the action of the cam bars forces the product change assembly downwards. Interaction between the alignment pins 88A, 88B and the alignment bores 90A, 90B prevents horizontal movement of the product change frame relative to the tester chassis. Accordingly, the connectors 82 on the underside of the DUT board engage the connectors 20 on the upper side of the interconnection board 16, thereby establishing electrical connection between the pins of the pin electronics boards and the appropriate pins of the DUT sockets.

Subsequently, in the event that it is necessary to remove the product change assembly, the technician operates the control knob 70 to transfer the valve 36 to the extraction position. In the extraction position, the valve supplies compressed air to the retraction port of the actuator and allows the extension port to vent. The mobile assembly returns to the position shown in FIGS. 3–5. During the return movement, the lower surfaces of the cam slots 70, 74 engage the cam followers 84, 86 and force the product change frame upwards relative to the tester chassis until the followers enter the respective dwells. At this point, the connectors are no longer engaged although the alignment pins 88A, 88B are still engaged with the alignment bores 90A, 90B. The technician can then lift the product change assembly from the insertion/extraction tool, removing the cam followers from the cam slots and disengaging the alignment pins from the alignment bores.

The illustrated insertion/extraction tool provides a compact and relatively simple mechanism for engaging a DUT board or other interface board and an interconnection board without risk of damage to the connectors.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. If the word "comprises" or "includes," or a derivative of either of these words is used in this specification, including the claims, it is used in an inclusive, not exclusive or exhaustive sense. Thus, for example, a statement that a component comprises first and second elements is not intended to exclude the possibility of the component including one or more additional elements.

The invention claimed is:

1. An integrated circuit tester comprising a tool for selectively engaging a product change element with a tester interface and disengaging the product change element from the tester interface, said tool comprising:
   a base frame attached to the tester interface,
   a mobile frame mounted to the base frame and constrained to move relative to the base frame along an axis of linear movement, and
   a force mechanism for urging the mobile frame to move along said axis of linear movement relative to the base frame, the force mechanism comprising first and second links each having a proximal end and a distal end, the links being pivotally connected together at their proximal ends and the distal ends of the first and second links being secured to the mobile frame and the base frame respectively, the distal ends of the links being spaced apart along said axis and the proximal ends of the links being between the distal ends relative to said axis, and the force mechanism also comprising an actuator coupled to the proximal ends of the links for urging the proximal ends of the links in directions transverse to said axis, whereby the spacing of the distal ends of the links along said axis changes and the mobile frame moves relative to the base frame along said axis,
   and wherein the mobile frame interacts with the product change element in a manner such that movement of the mobile frame relative to the base frame in a first direction along said axis forces the product change element towards the base frame and movement of the mobile frame relative to the base frame in a second direction, opposite said first direction, forces the product change element away from the base frame.

2. A tester according to claim 1, wherein the force mechanism further comprises third and fourth links each having a proximal end and a distal end, the third and fourth links are pivotally connected together at their proximal ends, the distal ends of the third and fourth links are secured to the mobile frame and the base frame respectively, the distal ends of the third and fourth links are spaced apart transverse to said axis from the distal ends of the first and second links, the distal ends of the third and fourth links are spaced apart along said axis, the proximal ends of the third and fourth links are between the distal ends of the third and fourth links relative to said axis, and the actuator is coupled to the proximal ends of the third and fourth links for urging the proximal ends of the third and fourth links in directions transverse to said axis, whereby the spacing of the distal ends of the third and fourth links along said axis changes and the mobile frame moves relative to the base frame along said axis.

3. A tester according to claim 2, wherein the proximal ends of the first and second links and the proximal ends of the third and fourth links are between the distal ends of the first and second links and the distal ends of the third and fourth links relative to a transverse axis that is perpendicular to said axis of linear movement, the actuator has first and second opposite ends spaced apart transverse to said axis, the first end of the actuator is coupled to the proximal ends of the first and second links, and the second end of the actuator is coupled to the proximal ends of the third and fourth links.

4. A tester according to claim 1, wherein the mobile frame includes first and second elongate cam bars oriented parallel to said axis of linear movement and spaced apart perpendicular to said axis, whereby the product change element can be placed between the cam bars, and each cam bar is formed with at least one cam slot for receiving a follower attached to the product change element.

5. A tester according to claim 4, wherein each cam bar is formed with at least one linear slot oriented parallel to a longitudinal axis of the cam bar, and the base frame includes first and second followers that engage the linear slots of the first and second cam bars respectively for restraining the cam bars against movement perpendicular to said axis.

* * * * *